(12) United States Patent
Jin

(10) Patent No.: US 11,669,672 B1
(45) Date of Patent: Jun. 6, 2023

(54) REGRESSION TEST METHOD, ELECTRONIC DEVICE AND STORAGE MEDIUM

(71) Applicant: BEIJING BAIDU NETCOM SCIENCE TECHNOLOGY CO., LTD., Beijing (CN)

(72) Inventor: Xin Jin, Beijing (CN)

(73) Assignee: BEIJING BAIDU NETCOM SCIENCE TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/884,899

(22) Filed: Aug. 10, 2022

(30) Foreign Application Priority Data

Nov. 16, 2021 (CN) .......................... 202111353264.1

(51) Int. Cl.
*G06F 30/398* (2020.01)

(52) U.S. Cl.
CPC .................................. *G06F 30/398* (2020.01)

(58) Field of Classification Search
USPC .................................................. 716/110–116
See application file for complete search history.

(56) References Cited

U.S. PATENT DOCUMENTS

| | | | | |
|---|---|---|---|---|
| 10,474,562 | B2 * | 11/2019 | Donaldson | G06F 11/3688 |
| 11,132,286 | B1 * | 9/2021 | Hicks | G06F 11/3676 |
| 11,263,116 | B2 * | 3/2022 | Hicks | G06F 11/3676 |
| 2020/0394127 | A1 * | 12/2020 | Hicks | G06F 11/3692 |

FOREIGN PATENT DOCUMENTS

| | | |
|---|---|---|
| CN | 102750153 A | 10/2012 |
| CN | 108268366 A | 7/2018 |
| CN | 110941545 A | 3/2020 |
| CN | 111045933 A | 4/2020 |
| CN | 112965903 A | 6/2021 |
| CN | 113391992 A | 9/2021 |

OTHER PUBLICATIONS

Extended European Search Report dated Apr. 19, 2023 for European application no. 22189426.4, 10 pages.
Pei, Hanyu et al: "A Distance-Based Dynamic Random Testing with Test Case Clustering", 2019 IEEE 19th International Conference on Software Quality, Reliability and Security (QRS), IEEE Jul. 22, 2019 (Jul. 22, 2019), pp. 46-53, XP033623437, DOI: 10.1109/QRS.2019.00019 [retrieved on Oct. 1, 2019].
Spieker, Helge et al: "Reinforcement learning for automatic test case prioritizing and seletion in continuos integration" Software Testing and Analysis, Nov. 9, 2018 (Nov. 9, 2019), pp. 12-22, XP055766642, 2 Penn Plaza, Suite 701, New York NY10121-0701 USA, DOI: 10.1145/3092703.3092709 ISBN: 978-1-4503-5076-1.

\* cited by examiner

*Primary Examiner* — Binh C Tat
(74) *Attorney, Agent, or Firm* — Brooks Kushman P.C.

(57) ABSTRACT

There is provided a regression test method, an electronic device and a storage medium, and relates to the field of artificial intelligence, such as artificial intelligence chips, cloud computing, intelligent voices, or the like. The method includes: when execution of any regression test is completed, determining a to-be-adjusted test case from test cases according to a current test result; and adjusting a randomization weight corresponding to a data range randomized by the to-be-adjusted test case in a current test.

10 Claims, 3 Drawing Sheets

REGRESSION TEST METHOD, ELECTRONIC DEVICE AND STORAGE MEDIUM

CROSS-REFERENCE TO RELATED APPLICATIONS

The present application claims the priority of Chinese Patent Application No. 202111353264.1, filed on Nov. 16, 2021, with the title of "REGRESSION TEST METHOD AND APPARATUS, ELECTRONIC DEVICE AND STORAGE MEDIUM." The disclosure of the above application is incorporated herein by reference in its entirety.

FIELD OF THE DISCLOSURE

The present disclosure relates to the field of artificial intelligence technologies, and particularly to a regression test method, an electronic device and a storage medium in the fields of artificial intelligence chips, cloud computing, intelligent voices, or the like.

BACKGROUND OF THE DISCLOSURE

A regression test is an important test in verification of an integrated circuit (IC) chip which may be an intelligent voice chip, or the like. A large number of random cases may be generated in a regression test process to traverse and simulate various situations, and a code coverage rate, or the like, may be improved effectively by the regression test.

In practical applications, usually, the regression test is required to take a long time and is inefficient, but there is no better solution to this problem currently.

SUMMARY OF THE DISCLOSURE

The present disclosure provides a regression test method, an electronic device and a storage medium.

A method for regression test includes when execution of any regression test is completed, determining a to-be-adjusted test case from test cases according to a current test result; and adjusting a randomization weight corresponding to a data range randomized by the to-be-adjusted test case in a current test.

An electronic device includes at least one processor; and a memory communicatively connected with the at least one processor; wherein the memory stores instructions executable by the at least one processor, and the instructions are executed by the at least one processor to enable the at least one processor to perform a method for regression test, wherein the method includes: when execution of any regression test is completed, determining a to-be-adjusted test case from test cases according to a current test result; and adjusting a randomization weight corresponding to a data range randomized by the to-be-adjusted test case in a current test.

There is provided a non-transitory computer readable storage medium with computer instructions stored thereon, wherein the computer instructions are used for causing a method for regression test, wherein the method includes when execution of any regression test is completed, determining a to-be-adjusted test case from test cases according to a current test result; and adjusting a randomization weight corresponding to a data range randomized by the to-be-adjusted test case in a current test.

It should be understood that the statements in this section are not intended to identify key or critical features of the embodiments of the present disclosure, nor limit the scope of the present disclosure. Other features of the present disclosure will become apparent from the following description.

BRIEF DESCRIPTION OF DRAWINGS

The drawings are used for better understanding the present solution and do not constitute a limitation of the present disclosure. In the drawings.

DETAILED DESCRIPTION OF PREFERRED EMBODIMENTS

The following part will illustrate exemplary embodiments of the present disclosure with reference to the drawings, including various details of the embodiments of the present disclosure for a better understanding. The embodiments should be regarded only as exemplary ones. Therefore, those skilled in the art should appreciate that various changes or modifications can be made with respect to the embodiments described herein without departing from the scope and spirit of the present disclosure. Similarly, for clarity and conciseness, the descriptions of the known functions and structures are omitted in the descriptions below.

In addition, it should be understood that the term "and/or" only describes an association relationship between associated objects, and indicates that three relationships may exist. For example, A and/or B may indicate three cases: only A exists; both A and B exist; and only B exists. In addition, in this specification, the symbol "/" generally indicates that associated objects have a relationship of "or".

Figure 1:
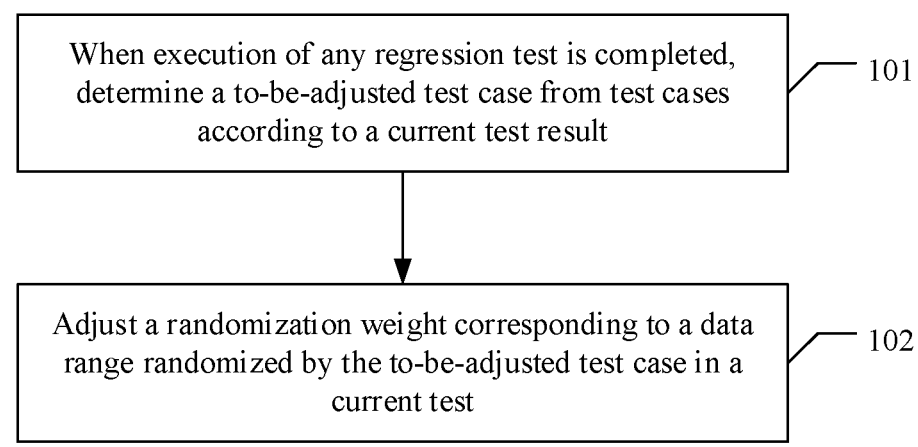
FIG. 1 is a flow chart of a method for regression test according to a first embodiment of the present disclosure.

FIG. 1 is a flow chart of a method for regression test according to a first embodiment of the present disclosure. As shown in FIG. 1, the method includes the following implementation steps of:

Step 101: when execution of any regression test is completed, determining a to-be-adjusted test case from test cases according to a current test result; and Step 102: adjusting a randomization weight corresponding to a data range randomized by the to-be-adjusted test case in a current test.

It is observed that in the solution of the above method embodiment, an adaptive-adjustment regression test method is adopted, such that a data randomization direction of a subsequent regression test may be adjusted according to the test result of the performed regression test, thereby improving test efficiency, or the like.

In practical applications, usually, plural regression tests are performed on a tested object until an end condition is met, for example, a predetermined code coverage rate requirement is met.

In the solution of the present disclosure, when the execution of any regression test is completed, the to-be-adjusted test case may be determined from the test cases according to the current test result. The current test refers to a most recently executed regression test.

In one embodiment of the present disclosure, the to-be-adjusted test case may include a positive to-be-adjusted test case, and correspondingly, the step of determining a positive to-be-adjusted test case from test cases according to a current test result may include: for any test case with a current test result of pass, if test results of the test case in continuous M tests including the current test are determined to be pass, using the test case as the positive to-be-adjusted test case, M being a positive integer.

All test cases may be used for each regression test, and the test result of each test case is either pass or fail.

A specific value of M may be determined according to actual requirements, and may be 1, or greater than 1. If the value of M is 1, if the current test result of any test case is pass, the test case may be taken as a positive to-be-adjusted test case; if the value of M is greater than 1, and is assumed to be 3, when test results of the test case in the current test and two tests before the current test are pass, the test case may be taken as a positive to-be-adjusted test case. The specific way may be determined according to actual requirements, which is quite flexible and convenient.

A randomization weight corresponding to a data range randomized by any positive to-be-adjusted test case in the current test may be adjusted, and in one embodiment of the present disclosure, the randomization weight corresponding to the data range randomized by the positive to-be-adjusted test case in the current test may be reduced, and randomization weights corresponding to other data ranges may be unchanged.

Usually, the higher the randomization weight is, the greater the randomized probability is, and conversely, the smaller the randomized probability is, and therefore, by reducing the randomization weight corresponding to the data range randomized by the positive to-be-adjusted test case in the current test, and other data ranges may be randomized as far as possible during a next test, so as to realize a fast increase of the code coverage rate, i.e., an improvement of the test efficiency, or the like.

For each test case, during initialization, i.e., before a first regression test is performed, an initial randomization weight may be set; for example, the randomization weights corresponding to different data ranges may be set to be the same; that is, case data is completely random within a required range; a local key test may also be supported; that is, during initialization, a randomization weight different from other randomization weights may be set for a specific data range, and a specific implementation is not limited.

In one embodiment of the present disclosure, for any positive to-be-adjusted test case, a current adjustment value may be determined first, and then, the adjustment value may be subtracted from the randomization weight currently corresponding to the data range randomized by the positive to-be-adjusted test case in the current test, thereby obtaining a reduced randomization weight.

In one embodiment of the present disclosure, a preset adjustment step may be used as the adjustment value, or the adjustment value may be determined in conjunction with the adjustment step and a preset rule. That is, the solution according to the present disclosure supports different adjustment value determination manners, which is quite flexible and convenient.

A specific value of the adjustment step may be determined according to actual requirements, and may be modified/adjusted at any time according to actual requirements after set.

Correspondingly, during determination of the adjustment value, a current adjustment step may be used as the adjustment value directly, or the adjustment value may be determined in conjunction with the current adjustment step and the preset rule, and the specific rule is not limited, and may also be determined according to actual requirements; for example, a product of M and the adjustment step may be used as the adjustment value.

In one embodiment of the present disclosure, the to-be-adjusted test case may also include a negative to-be-adjusted test case, and correspondingly, the step of determining a negative to-be-adjusted test case from test cases according to a current test result may include: using a test case with the current test result of fail as the negative to-be-adjusted test case.

A randomization weight corresponding to a data range randomized by any negative to-be-adjusted test case in the current test may be adjusted, and in one embodiment of the present disclosure, the randomization weight corresponding to the data range randomized by the negative to-be-adjusted test case in the current test may be increased, and randomization weights corresponding to other data ranges may be unchanged.

By increasing the randomization weight corresponding to the data range randomized by the negative to-be-adjusted test case in the current test, the data range may be randomized as far as possible during a next test, so as to realize a key test, or the like, near an error region.

In one embodiment of the present disclosure, for any negative to-be-adjusted test case, a current adjustment value may be determined first, and then, the adjustment value may be added to the randomization weight currently corresponding to the data range randomized by the negative to-be-adjusted test case in the current test, thereby obtaining an increased randomization weight.

In one embodiment of the present disclosure, a preset adjustment step may be used as the adjustment value, or the adjustment value may be determined in conjunction with the adjustment step and a preset rule.

A specific value of the adjustment step may be determined according to actual requirements, and may be modified/adjusted at any time according to actual requirements after set.

Correspondingly, during determination of the adjustment value, a current adjustment step may be used as the adjustment value directly, or the adjustment value may be determined in conjunction with the current adjustment step and the preset rule, and the specific rule is not limited.

Figure 2:
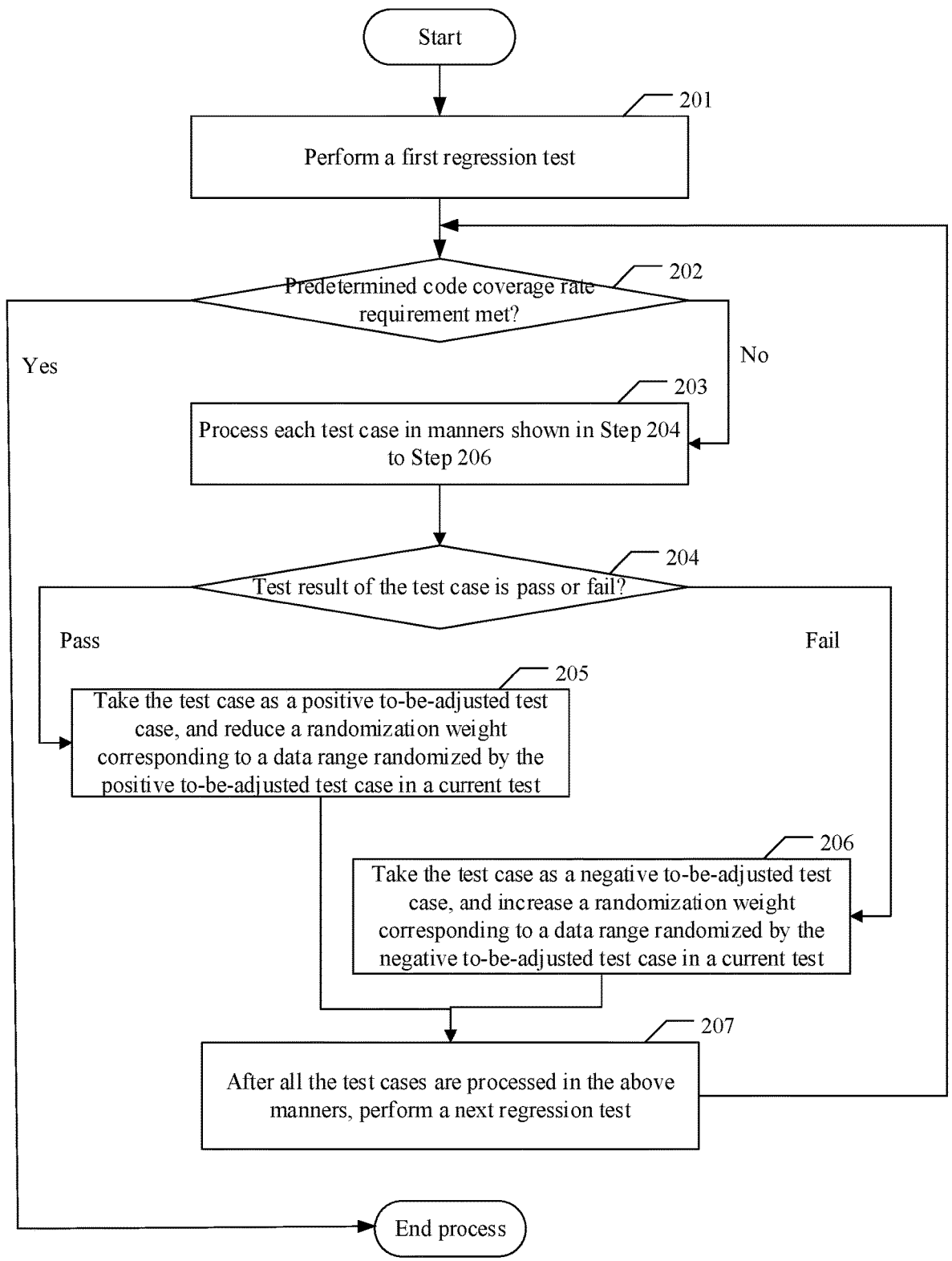
FIG. 2 is a flow chart of a method for regression test according to a second embodiment of the present disclosure.

Based on the above-mentioned description, FIG. 2 is a flow chart of a method for regression test according to a second embodiment of the present disclosure. As shown in FIG. 2, the method includes the following implementation steps of:

Step 201: performing a first regression test.

For each test case, an initial randomization weight may be set during initialization.

Step 202: determining whether a predetermined code coverage rate requirement is met, if yes, ending the process, and if no, executing Step 203.

Step 203: processing each test case in manners shown in Step 204 to Step 206.

Step 204: determining whether a test result of the test case is pass or fail, and if the test result is pass, executing Step 205, and if the test result is fail, executing Step 206.

Step 205: taking the test case as a positive to-be-adjusted test case, reducing a randomization weight corresponding to a data range randomized by the positive to-be-adjusted test case in a current test, and then, executing Step 207.

For example, a current adjustment value may be determined first, and then, the adjustment value may be subtracted from the randomization weight currently corresponding to the data range randomized by the positive to-be-adjusted test case in the current test, thereby obtaining a reduced randomization weight.

A preset adjustment step may be used as the adjustment value, or the adjustment value may be determined in conjunction with the adjustment step and a preset rule.

Assuming that the adjustment step is used as the adjustment value directly, a difference between the randomization weight before adjustment (the currently corresponding randomization weight) and the adjustment value may be calculated, and a calculation result is used as the adjusted randomization weight, i.e., the reduced randomization weight.

In addition, it is observed that a value of M is assumed to be 1 in the present embodiment.

Step 206: taking the test case as a negative to-be-adjusted test case, increasing a randomization weight corresponding to a data range randomized by the negative to-be-adjusted test case in a current test, and then, executing Step 207.

For example, a current adjustment value may be determined first, and then, the adjustment value may be added to the randomization weight currently corresponding to the data range randomized by the negative to-be-adjusted test case in the current test, thereby obtaining an increased randomization weight.

A preset adjustment step may be used as the adjustment value, or the adjustment value may be determined in conjunction with the adjustment step and a preset rule.

Assuming that the adjustment step is used as the adjustment value directly, a sum between the randomization weight before adjustment and the adjustment value may be calculated, and a calculation result is used as the adjusted randomization weight, i.e., the increased randomization weight.

Step 207: after all the test cases are processed in the above manners, performing a next regression test, and then, repeating Step 202.

A method of performing the regression test belongs to a prior art.

It should be noted that for simplicity of description, all the above-mentioned embodiments of the method are described as combinations of a series of acts, but those skilled in the art should understand that the present disclosure is not limited by the described order of acts, as some steps may be performed in other orders or simultaneously according to the present disclosure. Further, those skilled in the art should also understand that the embodiments described in this specification are preferred embodiments and that acts and modules referred to are not necessary for the present disclosure. In addition, for parts that are not described in detail in a certain embodiment, reference may be made to the related descriptions of other embodiments.

The above is a description of an embodiment of the method, and an embodiment of an apparatus according to the present disclosure will be further described below.

Figure 3:
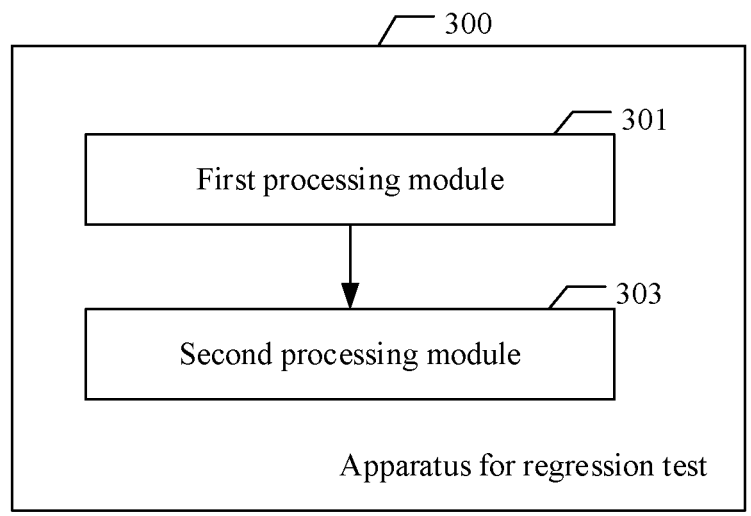
FIG. 3 is a schematic structural diagram of an apparatus 300 for regression test according to an embodiment of the present disclosure.

FIG. 3 is a schematic structural diagram of an apparatus 300 for regression test according to an embodiment of the present disclosure. As shown in FIG. 3, the apparatus for regression test includes a first processing module 301 configured to, when execution of any regression test is completed, determine a to-be-adjusted test case from test cases according to a current test result; and a second processing module 302 configured to adjust a randomization weight corresponding to a data range randomized by the to-be-adjusted test case in a current test.

In the solution of the above apparatus embodiment, an adaptive-adjustment regression test method is adopted, such that a data randomization direction of a subsequent regression test may be adjusted according to the test result of the performed regression test, thereby improving a test efficiency, or the like.

In practical applications, usually, plural regression tests are performed on a tested object until an end condition is met, for example, a predetermined code coverage rate requirement is met.

In the solution of the present disclosure, when the execution of any regression test is completed, the first processing module 301 may determine the to-be-adjusted test case from the test cases according to the current test result.

In one embodiment of the present disclosure, the to-be-adjusted test case may include a positive to-be-adjusted test case, and correspondingly, the first processing module 301 determining a positive to-be-adjusted test case from test cases according to a current test result may include: for any test case with a current test result of pass, if test results of the test case in continuous M tests including the current test are determined to be pass, using the test case as the positive to-be-adjusted test case, M being a positive integer.

All test cases may be used for each regression test, and the test result of each test case is either pass or fail.

A specific value of M may be determined according to actual requirements, and may be 1, or greater than 1. If the value of M is 1, if the current test result of any test case is pass, the test case may be taken as a positive to-be-adjusted test case; if the value of M is greater than 1, and is assumed to be 3, when test results of the test case in the current test and two tests before the current test are pass, the test case may be taken as a positive to-be-adjusted test case.

The second processing module 302 may adjust a randomization weight corresponding to a data range randomized by any positive to-be-adjusted test case in the current test, and in one embodiment of the present disclosure, may reduce the randomization weight corresponding to the data range randomized by the positive to-be-adjusted test case in the current test.

In one embodiment of the present disclosure, for any positive to-be-adjusted test case, the second processing module 302 may determine a current adjustment value first, and then subtract the adjustment value from the randomization weight corresponding to the data range randomized by the positive to-be-adjusted test case in the current test, thereby obtaining a reduced randomization weight.

In one embodiment of the present disclosure, a preset adjustment step may be used as the adjustment value, or the adjustment value may be determined in conjunction with the adjustment step and a preset rule.

In one embodiment of the present disclosure, the to-be-adjusted test case may also include a negative to-be-adjusted test case, and correspondingly, the first processing module 301 determining a negative to-be-adjusted test case from test cases according to a current test result may include: using a test case with the current test result of fail as the negative to-be-adjusted test case.

The second processing module 302 may adjust a randomization weight corresponding to a data range randomized by any negative to-be-adjusted test case in the current test, and in one embodiment of the present disclosure, may increase the randomization weight corresponding to the data range randomized by the negative to-be-adjusted test case in the current test, and randomization weights corresponding to other data ranges may be unchanged.

In one embodiment of the present disclosure, for any negative to-be-adjusted test case, the second processing module 302 may determine a current adjustment value first, and then add the adjustment value to the randomization weight corresponding to the data range randomized by the negative to-be-adjusted test case in the current test, thereby obtaining an increased randomization weight.

In one embodiment of the present disclosure, a preset adjustment step may be used as the adjustment value, or the adjustment value may be determined in conjunction with the adjustment step and a preset rule.

A specific value of the adjustment step may be determined according to actual requirements, and may be modified/adjusted at any time according to actual requirements after set.

For the specific work flow of the embodiment of the apparatus shown in FIG. 3, reference may be made to the related description in the foregoing embodiment of the method.

In conclusion, with the solution of the present disclosure, a data randomization direction of a subsequent regression test may be adjusted according to the test result of the performed regression test, thereby improving a test efficiency, realizing a key test near an error region, and guaranteeing a test effect; in addition, an implementation is simple, and general applicability, or the like, is achieved.

The solution of the present disclosure may be applied to the field of artificial intelligence, and particularly relates to the fields of artificial intelligence chips, cloud computing, intelligent voices, or the like. Artificial intelligence is a subject of researching how to cause a computer to simulate certain thought processes and intelligent behaviors (for example, learning, inferring, thinking, planning, or the like) of a human, and includes both hardware-level technologies and software-level technologies. Generally, the hardware technologies of the artificial intelligence include technologies, such as a sensor, a dedicated artificial intelligence chip, cloud computing, distributed storage, big data processing, or the like; the software technologies of the artificial intelligence mainly include a computer vision technology, a voice recognition technology, a natural language processing technology, a machine learning/deep learning technology, a big data processing technology, a knowledge graph technology, or the like.

In addition, in the technical solution of the present disclosure, the collection, storage, usage, processing, transmission, provision, disclosure, or the like, of involved user personal information are in compliance with relevant laws and regulations, and do not violate public order and good customs.

According to the embodiment of the present disclosure, there are also provided an electronic device, a readable storage medium and a computer program product.

Figure 4:
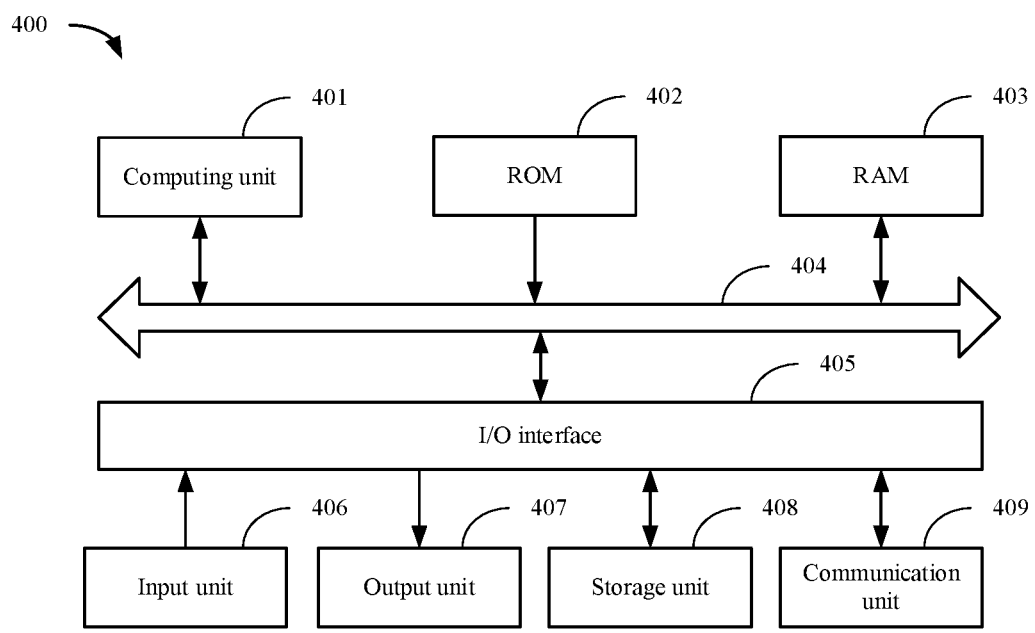
FIG. 4 shows a schematic block diagram of an electronic device 400 which may be configured to implement the embodiment of the present disclosure.

FIG. 4 shows a schematic block diagram of an electronic device 400 which may be configured to implement the embodiment of the present disclosure. The electronic device is intended to represent various forms of digital computers, such as laptop computers, desktop computers, workstations, servers, blade servers, mainframe computers, and other appropriate computers. The electronic device may also represent various forms of mobile apparatuses, such as personal digital assistants, cellular telephones, smart phones, wearable devices, and other similar computing apparatuses. The components shown herein, their connections and relationships, and their functions, are meant to be exemplary only, and are not meant to limit implementation of the present disclosure described and/or claimed herein.

As shown in FIG. 4, the device 400 includes a computing unit 401 which may perform various appropriate actions and processing operations according to a computer program stored in a read only memory (ROM) 402 or a computer program loaded from a storage unit 408 into a random access memory (RAM) 403. Various programs and data necessary for the operation of the device 400 may be also stored in the RAM 403. The computing unit 401, the ROM 402, and the RAM 403 are connected with one other through a bus 404. An input/output (I/O) interface 405 is also connected to the bus 404.

The plural components in the device 400 are connected to the I/O interface 405, and include: an input unit 406, such as a keyboard, a mouse, or the like; an output unit 407, such as various types of displays, speakers, or the like; the storage unit 408, such as a magnetic disk, an optical disk, or the like; and a communication unit 409, such as a network card, a modem, a wireless communication transceiver, or the like. The communication unit 409 allows the device 400 to exchange information/data with other devices through a computer network, such as the Internet, and/or various telecommunication networks.

The computing unit 401 may be a variety of general and/or special purpose processing components with processing and computing capabilities. Some examples of the computing unit 401 include, but are not limited to, a central processing unit (CPU), a graphic processing unit (GPU), various dedicated artificial intelligence (AI) computing chips, various computing units running machine learning model algorithms, a digital signal processor (DSP), and any suitable processor, controller, microcontroller, or the like. The computing unit 401 performs the methods and processing operations described above, such as the method according to the present disclosure. For example, in some embodiments, the method according to the present disclosure may be implemented as a computer software program tangibly contained in a machine readable medium, such as the storage unit 408. In some embodiments, part or all of the computer program may be loaded and/or installed into the device 400 via the ROM 402 and/or the communication unit 409. When the computer program is loaded into the RAM 403 and executed by the computing unit 401, one or more steps of the method according to the present disclosure may be performed. Alternatively, in other embodiments, the computing unit 401 may be configured to perform the method according to the present disclosure by any other suitable means (for example, by means of firmware).

Various implementations of the systems and technologies described herein above may be implemented in digital electronic circuitry, integrated circuitry, field programmable gate arrays (FPGA), application specific integrated circuits (ASIC), application specific standard products (ASSP), systems on chips (SOC), complex programmable logic devices (CPLD), computer hardware, firmware, software, and/or combinations thereof. The systems and technologies may be implemented in one or more computer programs which are executable and/or interpretable on a programmable system including at least one programmable processor, and the programmable processor may be special or general, and may receive data and instructions from, and transmit data and instructions to, a storage system, at least one input apparatus, and at least one output apparatus.

Program codes for implementing the method according to the present disclosure may be written in any combination of one or more programming languages. These program codes may be provided to a processor or a controller of a general purpose computer, a special purpose computer, or other programmable data processing apparatuses, such that the program code, when executed by the processor or the controller, causes functions/operations specified in the flowchart and/or the block diagram to be implemented. The program code may be executed entirely on a machine, partly on a machine, partly on a machine as a stand-alone software package and partly on a remote machine, or entirely on a remote machine or a server.

In the context of the present disclosure, the machine readable medium may be a tangible medium which may contain or store a program for use by or in connection with an instruction execution system, apparatus, or device. The machine readable medium may be a machine readable signal medium or a machine readable storage medium. The machine readable medium may include, but is not limited to, an electronic, magnetic, optical, electromagnetic, infrared, or semiconductor system, apparatus, or device, or any suitable combination of the foregoing. More specific examples of the machine readable storage medium may include an electrical connection based on one or more wires, a portable computer disk, a hard disk, a random access memory (RAM), a read only memory (ROM), an erasable programmable read only memory (EPROM or flash memory), an optical fiber, a portable compact disc read only memory (CD-ROM), an optical storage device, a magnetic storage device, or any suitable combination of the foregoing.

To provide interaction with a user, the systems and technologies described here may be implemented on a computer having: a display apparatus (for example, a cathode ray tube (CRT) or liquid crystal display (LCD) monitor) for displaying information to a user; and a keyboard and a pointing apparatus (for example, a mouse or a trackball) by which a user may provide input for the computer. Other kinds of apparatuses may also be used to provide interaction with a user; for example, feedback provided for a user may be any form of sensory feedback (for example, visual feedback, auditory feedback, or tactile feedback); and input from a user may be received in any form (including acoustic, speech or tactile input).

The systems and technologies described here may be implemented in a computing system (for example, as a data server) which includes a back-end component, or a computing system (for example, an application server) which includes a middleware component, or a computing system (for example, a user computer having a graphical user interface or a web browser through which a user may interact with an implementation of the systems and technologies described here) which includes a front-end component, or a computing system which includes any combination of such back-end, middleware, or front-end components. The components of the system may be interconnected through any form or medium of digital data communication (for example, a communication network). Examples of the communication network include: a local area network (LAN), a wide area network (WAN) and the Internet.

A computer system may include a client and a server. Generally, the client and the server are remote from each other and interact through the communication network. The relationship between the client and the server is generated by virtue of computer programs which run on respective computers and have a client-server relationship to each other. The server may be a cloud server or a server of a distributed system, or a server incorporating a blockchain.

It should be understood that various forms of the flows shown above may be used and reordered, and steps may be added or deleted. For example, the steps described in the present disclosure may be executed in parallel, sequentially, or in different orders, which is not limited herein as long as the desired results of the technical solution disclosed in the present disclosure may be achieved.

The above-mentioned implementations are not intended to limit the scope of the present disclosure. It should be understood by those skilled in the art that various modifications, combinations, sub-combinations and substitutions may be made, depending on design requirements and other factors. Any modification, equivalent substitution and improvement made within the spirit and principle of the present disclosure all should be included in the extent of protection of the present disclosure.

What is claimed is:

1. A method for regression test, comprising:
   when execution of any regression test is completed, determining a to-be-adjusted test case from test cases according to a current test result, comprising: for any test case with a current test result of pass, if test results of the test case in continuous M tests comprising the current test are determined to be pass, using the test case as a positive to-be-adjusted test case, M being a positive integer; and using a test case with the current test result of fail as a negative to-be-adjusted test case; and
   adjusting a randomization weight corresponding to a data range randomized by the to-be-adjusted test case in a current test, wherein the higher the randomization weight is, the greater the randomized probability is, and conversely, the smaller the randomized probability is, comprising: reducing the randomization weight corresponding to the data range randomized by the positive to-be-adjusted test case in the current test; and increasing the randomization weight corresponding to the data range randomized by the negative to-be-adjusted test case in the current test; and
   performing a next regression test after all the test cases are processed until a predetermined code coverage rate requirement is met wherein the reducing the randomization weight corresponding to the data range randomized by the positive to-be-adjusted test case in the current test comprises:
   determining a current adjustment value; and
   subtracting the adjustment value from the randomization weight corresponding to the data range randomized by the positive to-be-adjusted test case in the current test, so as to obtain a reduced randomization weight.

2. The method according to claim 1, wherein the increasing the randomization weight corresponding to the data range randomized by the negative to-be-adjusted test case in the current test comprises:
   determining a current adjustment value; and
   adding the adjustment value to the randomization weight corresponding to the data range randomized by the negative to-be-adjusted test case in the current test, so as to obtain an increased randomization weight.

3. The method according to claim 1, wherein the determining a current adjustment value comprises:
   using a preset adjustment step as the adjustment value; or
   determining the adjustment value in conjunction with the adjustment step and a preset rule.

4. The method according to claim 2, wherein the determining a current adjustment value comprises:
   using a preset adjustment step as the adjustment value; or determining the adjustment value in conjunction with the adjustment step and a preset rule.

5. An electronic device, comprising:
at least one processor; and
a memory communicatively connected with the at least one processor;
wherein the memory stores instructions executable by the at least one processor, and the instructions are executed by the at least one processor to enable the at least one processor to perform a method for regression test, wherein the method comprises:
when execution of any regression test is completed, determining a to-be-adjusted test case from test cases according to a current test result, comprising: for any test case with a current test result of pass, if test results of the test case in continuous M tests comprising the current test are determined to be pass, using the test case as a positive to-be-adjusted test case, M being a positive integer; and using a test case with the current test result of fail as a negative to-be-adjusted test case; and
adjusting a randomization weight corresponding to a data range randomized by the to-be-adjusted test case in a current test, wherein the higher the randomization weight is, the greater the randomized probability is, and conversely, the smaller the randomized probability is, comprising: reducing the randomization weight corresponding to the data range randomized by the positive to-be-adjusted test case in the current test; and increasing the randomization weight corresponding to the data range randomized by the negative to-be-adjusted test case in the current test; and
performing a next regression test after all the test cases are processed until a predetermined code coverage rate requirement is met wherein the reducing the randomization weight corresponding to the data range randomized by the positive to-be-adjusted test case in the current test comprises:
determining a current adjustment value; and
subtracting the adjustment value from the randomization weight corresponding to the data range randomized by the positive to-be-adjusted test case in the current test, so as to obtain a reduced randomization weight.

6. The electronic device according to claim 5,
wherein the reducing the randomization weight corresponding to the data range randomized by the positive to-be-adjusted test case in the current test comprises: determining a current adjustment value, and subtracting the adjustment value from the randomization weight corresponding to the data range randomized by the positive to-be-adjusted test case in the current test, so as to obtain a reduced randomization weight.

7. The electronic device according to claim 5,
wherein the increasing the randomization weight corresponding to the data range randomized by the negative to-be-adjusted test case in the current test comprises: determining a current adjustment value, and adding the adjustment value to the randomization weight corresponding to the data range randomized by the negative to-be-adjusted test case in the current test, so as to obtain an increased randomization weight.

8. The electronic device according to claim 6,
wherein the determining a current adjustment value comprises: using a preset adjustment step as the adjustment value, or determining the adjustment value in conjunction with the adjustment step and a preset rule.

9. The electronic device according to claim 7,
wherein the determining a current adjustment value comprises: using a preset adjustment step as the adjustment value, or determining the adjustment value in conjunction with the adjustment step and a preset rule.

10. A non-transitory computer readable storage medium with computer instructions stored thereon, wherein the computer instructions are used for causing a method for regression test, wherein the method comprises:
when execution of any regression test is completed, determining a to-be-adjusted test case from test cases according to a current test result, comprising: for any test case with a current test result of pass, if test results of the test case in continuous M tests comprising the current test are determined to be pass, using the test case as a positive to-be-adjusted test case, M being a positive integer; and using a test case with the current test result of fail as a negative to-be-adjusted test case; and
adjusting a randomization weight corresponding to a data range randomized by the to-be-adjusted test case in a current test, wherein the higher the randomization weight is, the greater the randomized probability is, and conversely, the smaller the randomized probability is, comprising: reducing the randomization weight corresponding to the data range randomized by the positive to-be-adjusted test case in the current test; and increasing the randomization weight corresponding to the data range randomized by the negative to-be-adjusted test case in the current test; and
performing a next regression test after all the test cases are processed until a predetermined code coverage rate requirement is met wherein the reducing the randomization weight corresponding to the data range randomized by the positive to-be-adjusted test case in the current test comprises:
determining a current adjustment value; and
subtracting the adjustment value from the randomization weight corresponding to the data range randomized by the positive to-be-adjusted test case in the current test, so as to obtain a reduced randomization weight.

* * * * *